United States Patent
Lee et al.

(10) Patent No.: US 9,530,964 B2
(45) Date of Patent: Dec. 27, 2016

(54) METHOD OF MANUFACTURING DISPLAY AND APPARATUS FOR MANUFACTURING THE DISPLAY FOR THE SAME

(71) Applicant: SAMSUNG DISPLAY CO., LTD., Yongin-si, Gyeonggi-do (KR)

(72) Inventors: Donghoon Lee, Yongin-si (KR); Joonhyung Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/952,740

(22) Filed: Nov. 25, 2015

(65) Prior Publication Data

US 2016/0276589 A1 Sep. 22, 2016

(30) Foreign Application Priority Data

Mar. 20, 2015 (KR) .................. 10-2015-0039027

(51) Int. Cl.
| | |
|---|---|
| *H01L 21/00* | (2006.01) |
| *H01L 51/00* | (2006.01) |
| *H01L 51/56* | (2006.01) |

(52) U.S. Cl.
CPC ......... *H01L 51/003* (2013.01); *H01L 51/0097* (2013.01); *H01L 51/56* (2013.01); *H01L 2251/5338* (2013.01)

(58) Field of Classification Search
CPC .... H01L 51/003; H01L 51/0097; H01L 51/56; H01L 27/1266; H01L 21/2007
USPC ................ 438/26, 27, 28, 30, 458, 459, 464
See application file for complete search history.

(56) References Cited

U.S. PATENT DOCUMENTS

| | | | |
|---|---|---|---|
| 7,892,867 B2* | 2/2011 | Shinn | G02F 1/1303 257/E21.532 |
| 2003/0222334 A1* | 12/2003 | Ikeda | G02F 1/13454 257/678 |
| 2013/0128910 A1 | 5/2013 | Matsuda et al. | |
| 2013/0130420 A1 | 5/2013 | Chen et al. | |
| 2014/0102643 A1 | 4/2014 | Porneala et al. | |
| 2014/0134913 A1 | 5/2014 | Yeo et al. | |

FOREIGN PATENT DOCUMENTS

| | | |
|---|---|---|
| JP | 2013-235276 A | 11/2013 |
| KR | 10-2014-0055258 A | 5/2014 |
| KR | 10-2014-0062368 A | 5/2014 |

* cited by examiner

*Primary Examiner* — Kevin M Picardat
(74) *Attorney, Agent, or Firm* — Lewis Roca Rothgerber Christie LLP

(57) ABSTRACT

In a method of manufacturing a display, the method includes: forming a display device on a substrate attached to a first surface of a carrier; arranging, on a second surface of the carrier, a shield that corresponds to at least a portion of edge areas of the substrate and comprises non-transparent shielding areas; and irradiating light onto the second surface of the carrier to separate a portion of the substrate from the carrier.

10 Claims, 2 Drawing Sheets

METHOD OF MANUFACTURING DISPLAY AND APPARATUS FOR MANUFACTURING THE DISPLAY FOR THE SAME

CROSS-REFERENCE TO RELATED APPLICATION

This application claims priority to and the benefit of Korean Patent Application No. 10-2015-0039027, filed on Mar. 20, 2015, in the Korean Intellectual Property Office, the disclosure of which is incorporated herein in its entirety by reference.

BACKGROUND

1. Field

Aspects of one or more example embodiments of the present invention relate to a method of manufacturing a display and an apparatus for manufacturing a display.

2. Description of the Related Art

In general, a display may be manufactured by forming a plurality of display devices on a substrate. When the substrate has the appropriate degree of hardness, it may be relatively easy to handle the substrate during the manufacturing process the display device and various components of the display device.

However, in the case of manufacturing a flexible display, because a substrate used therefor is flexible, it may be difficult to handle the flexible substrate while the flexible substrate is transported in each process or between processes, without damaging the display device or components of the display device.

The above information disclosed in this Background section is only to enhance the understanding of the background of the invention, and therefore it may contain information that does not constitute prior art.

SUMMARY

Aspects of some example embodiments of the present invention relate to a method of manufacturing a display capable of preventing the occurrence of defects during manufacture and reducing manufacturing costs, and an apparatus for manufacturing a display which is suitable for the method.

Aspects of some example embodiments include a method of manufacturing a display capable of preventing the occurrence of defects and reducing manufacturing costs and an apparatus for manufacturing a display which is suitable for the method in order to solve various problems including the above-described problems. However, the scope of the present invention is not limited thereto.

Additional aspects will be set forth in part in the description which follows and, in part, will be apparent from the description, or may be learned by practice of the presented embodiments.

According to one or more example embodiments, a method of manufacturing a display includes: forming a display device on a substrate attached to a first surface of a carrier; arranging, on a second surface of the carrier, a shield that corresponds to at least a portion of edge areas of the substrate and comprises non-transparent shielding areas; and irradiating light onto the second surface of the carrier to separate a portion of the substrate from the carrier.

In the irradiating the light onto the second surface of the carrier, a portion of the light may be blocked by the shielding areas.

In the irradiating, the light may have an intensity at which a portion of the substrate, onto which the light is irradiated, may be separated from the carrier.

The method may further include forming the substrate by coating a material for forming the substrate on the first surface of the carrier.

The method may further include detaching at least a portion of the substrate, which is separated from the carrier, by cutting the substrate.

The method may further include attaching a functional film to a surface of the substrate that has contacted the carrier, and the attaching may be performed right after the detaching is performed.

The method may further include mechanically detaching the substrate from the carrier.

The method may further include attaching a functional film to a surface of the substrate that has contacted the carrier, and the attaching may be performed right after the detaching is performed.

The arranging may include arranging the shield having a first shielding area and a second shielding area which are separated from each other.

The carrier may be transparent.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
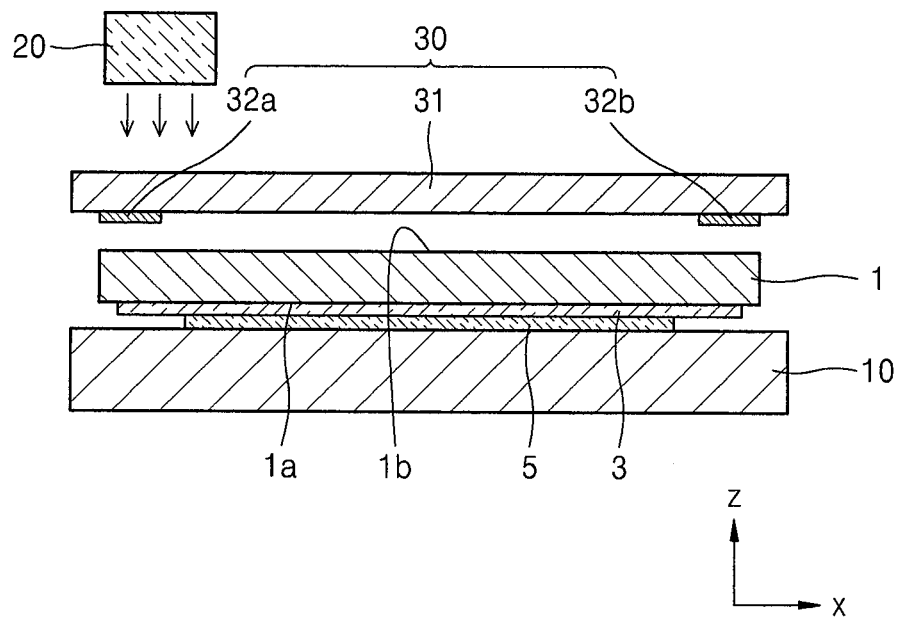
FIG. 1 is a schematic cross-sectional view for explaining a process of a method of manufacturing a display, according to an example embodiment of the present invention.

The attached drawings for illustrating example embodiments of the present invention are referred to in order to gain further understanding of aspects of the present invention. The present invention may, however, be embodied in many different forms and should not be construed as being limited to the example embodiments set forth herein; rather, these example embodiments are provided so that this disclosure will be more thorough and more complete, and will more fully convey the concept of the invention to those skilled in the art.

Hereinafter, the present invention will be described in more detail by explaining example embodiments of the present invention with reference to the attached drawings. Like reference numerals in the drawings denote like elements, and their descriptions will be omitted.

It will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, since sizes and thicknesses of components in the drawings are arbitrarily illustrated for convenience of explanation, the following example embodiments are not limited thereto.

It will be understood that when an element or layer is referred to as being "on," "connected to," or "coupled to"

another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic cross-sectional view for explaining a process of a method of manufacturing a display, according to an example embodiment.

First, a carrier 1 is prepared. As described below, when at least a portion of a substrate 3 is separated from the carrier 1, light passes through the carrier 1, and thus, the carrier 1 is transparent. For example, the carrier 1 may be formed of a glass material, or any other suitable transparent substrate material.

After the carrier 1 is prepared, the substrate 3 is attached to a first surface 1a of the carrier 1. The substrate 3 attached to the first surface 1a of the carrier 1 may include various materials, for example, resin such as polyimide. In this case, when the first surface 1a of the carrier 1 faces upward, the substrate 3 may be formed by coating a material for forming the substrate 3 onto the first surface 1a of the carrier 1 and then curing the coated material. During the above process, the substrate may be attached to the first surface 1a of the carrier 1 without an adhesive, etc. The substrate 3 itself may be flexible and accordingly, may be used to implement a flexible display.

Display devices are formed on the substrate 3 attached to the first surface 1a of the carrier 1. FIG. 1 illustrates that a device layer 5 including the display devices is formed on the substrate 3. The device layer 5 may further include a variety of electronic devices such as thin film transistors (TFTs) or capacitors, in addition to the display devices and may include insulating layers such as buffer layers. Furthermore, it may be understood that the device layer 5 may also include an encapsulation layer covering the display devices in order to protect the same.

Then, as illustrated in FIG. 1, the carrier is arranged or positioned on the stage 10. In detail, the stage 10 is arranged or positioned such that the first surface 1a of the carrier 1 faces downward (a −z direction). Accordingly, the device layer 5, which is formed on the substrate 3 attached to the first surface 1a of the carrier 1, is arranged or positioned on the stage 10. That is, the device layer 5 contacts an upper surface of the stage 10 in an upward direction (a +z direction).

The carrier 1 may not be arranged or positioned on the stage 10 because the substrate 3 is not completely separated from the carrier 1, as described below. However, a supporting member may be utilized to support the carrier 1 to which the substrate 3 is attached. The supporting member may be a frame, or the like which supports edge areas of carrier 1 or the substrate 3. It may be understood that the frame is a type of the stage 10.

A shield 30 including first shielding areas 32a and 32b, which correspond to at least some edge areas of the substrate 3 and are not transparent, may be arranged or positioned on a second surface 1b of the carrier 1. The shield 30 includes a transparent plate 31 and may allow the first shielding areas 32a and 32b to be arranged or positioned on the transparent plate 31. For example, the transparent plate 31 may be formed of a glass material, and the first shielding areas 32a and 32b may be formed of various metals such as chromium (Cr).

Figure 2:
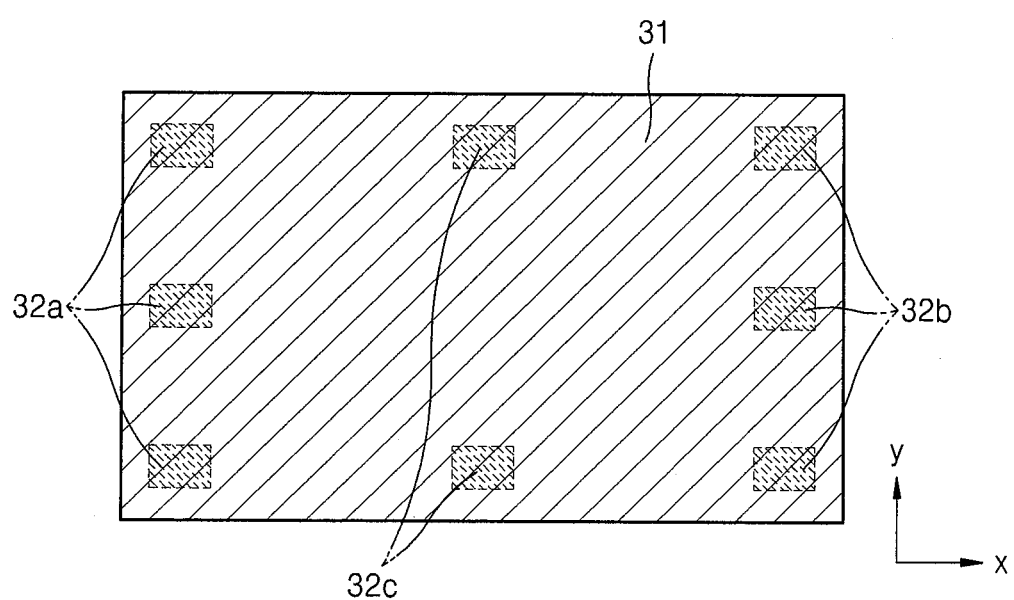
FIG. 2 is a schematic plan view of the shield of FIG. 1.

As illustrated in FIG. 2, which is a plan view schematically illustrating the shield 30, the shield 30 may also include second shielding areas 32c arranged or positioned on edge areas of the transparent plate 31 in a +y direction or a −y direction, other than the first shielding areas 32a arranged or positioned on the edge areas of the transparent plate 31 in a −x direction and the first shielding areas 32b arranged or positioned on the edge areas of the transparent plate 31 in a +x direction.

As shown in FIG. 1, the shield 30 may be separated from the carrier 1 and arranged or positioned on an upper portion of the second surface 1b of the carrier 1 (the +z direction), but the present invention is not limited thereto. For example, the shield 30 may contact the second surface 1b of the carrier 1.

Light is irradiated onto the second surface 1b of the carrier 1 in order to separate a portion of the substrate 3 from the carrier 1. In this case, as illustrated in FIG. 1, because the shield 30 is arranged or positioned between the second surface 1b of the carrier 1 and a light source 20, the light is not irradiated onto portions of the second surface 1b of the carrier 1, which correspond to the shielding areas 32a, 32b, and 32c, but mostly irradiated onto portions of the second surface 1b of the carrier 1, which do not correspond to the shielding areas 32a, 32b, and 32c.

The light reaching the second surface 1b of the carrier 1 passes through the carrier 1 that is transparent and then reaches the substrate 3 attached to the first surface 1a of the carrier 1. Accordingly, portions of a surface of the substrate 3, which are irradiated with the light and face the first surface 1a of the carrier 1, are mostly separated from the first surface 1a of the carrier 1. In detail, when the light reaches an interface between the first surface 1a of the carrier 1 and the substrate 3, bonding of the substrate 3 to the first surface 1a of the carrier 1 breaks due to the light, and thus, the portions of the surface of the substrate 3, which are irradiated with the light and face the first surface 1a of the carrier 1, are mostly separated from the first surface 1a of the carrier 1.

As described above, because the shield 30 is arranged or positioned such that the first and second shielding areas 32a, 32b, and 32c, which are disposed on the second surface 1b of the carrier 1 and are transparent, correspond to at least some portions of the edge areas of the substrate 3, remaining portions of the substrate 3, other than the at least some portions of the edge areas of the substrate 3, are separated from the first surface 1a of the carrier 1. If an intensity of the light irradiated onto the second surface 1b of the carrier 1 from the light source 20 is too low, the substrate 3 may not be separated from the carrier 1. Thus, the intensity of the light irradiated onto the second surface 1b of the carrier 1 from the light source 20 is an intensity at which the substrate 3 is separated from the carrier 1 when the light reaches the substrate 3. The light may be a laser beam.

A thickness of the substrate 3 may be relatively thin, in order to manufacture a thin display, and thus, it may not be easy to handle the substrate 3 while the substrate 3 is transported in each process or between processes of manufacturing a display: For example, if the substrate 3 is flexible, it may be highly difficult to handle the substrate 3. Therefore, according to some embodiments of the present invention, the carrier 1 that is solid may be utilized to manufacture a display.

When a display is manufactured by using the carrier 1, the substrate 3 may be separated from the carrier 1 during the manufacturing process. However, after the substrate 3, on which the device layer 5, etc. is formed, is separated from the carrier 1, further processing and handling of the substrate 3 may be performed. For example, in order to attach a protective film, the substrate 3 may be transported from a separating device, which is configured to separate the substrate 3 from the carrier 1, to a film attaching device, which is configured to attach the protective film to the substrate 3, the device layer 5, or the like. In this case, if the substrate 3 is transported while the substrate 3 is completely separated from the carrier 1, various situations, for example, a situation in which a location of the substrate 3 on the carrier 1, etc. changes, may occur, and accordingly, relative locations of the protective film and the substrate 3 change. As a result, the protective film may not be properly attached to the substrate 3. Alternatively, end portions of the substrate 3 that is thin and flexible may be rolled.

However, according to the method of manufacturing a display according to the present example embodiments of the present invention, most portions of the substrate 3 are separated from the carrier 1, but at least some portions of the edge areas of the substrate 3 are not separated from the carrier 1. Therefore, as described above, a change of the location of the substrate 3 on the carrier 1, etc., may be effectively prevented while the substrate 3 and/or the carrier 1 are being handled. Because the at least some portions of the substrate 3 are not separated from the carrier 1, instances of the end portions of the substrate 3 that is thin and flexible being rolled may be effectively prevented or reduced.

According to some example embodiments, a fixing film configured to temporarily fix the carrier 1 onto the substrate 3, and separating an entire portion of the substrate 3 from the carrier 1 without using the shield 30 may be utilized. In this case, although the substrate 3 is completely separated from the carrier 1, the substrate 3 may be temporarily fixed to the carrier 1 by the fixing film. However, in this case, a process of attaching the fixing film is additionally performed during the manufacture of the display, and also costs for using the fixing film are spent. However, in the method of manufacturing a display according to the present example embodiment, additional costs may be eliminated or reduced, and a manufacturing procedure is relatively simple.

The substrate 3 may be completely separated from the carrier 1 in order to attach the protective film to the substrate 3, the device layer 5, or the like. In this case, the substrate 3 may be transported in the vicinity of the film attaching device even though the substrate 3 is not completely separated from the carrier 1, and then the substrate 3 may be completely separated from the carrier 1 right before the substrate 3 enters the film attaching device, thereby greatly decreasing a defect occurrence probability during the manufacture of the display.

Methods of completely separating the substrate 3 from the carrier 1 may vary.

For example, the substrate 3 may be mechanically detached from the carrier 1. The detaching may be performed by positioning a vacuum chuck on the device layer 5, adsorbing the device layer 5, and then making the vacuum chuck relatively move farther from the carrier 1.

Figure 3:
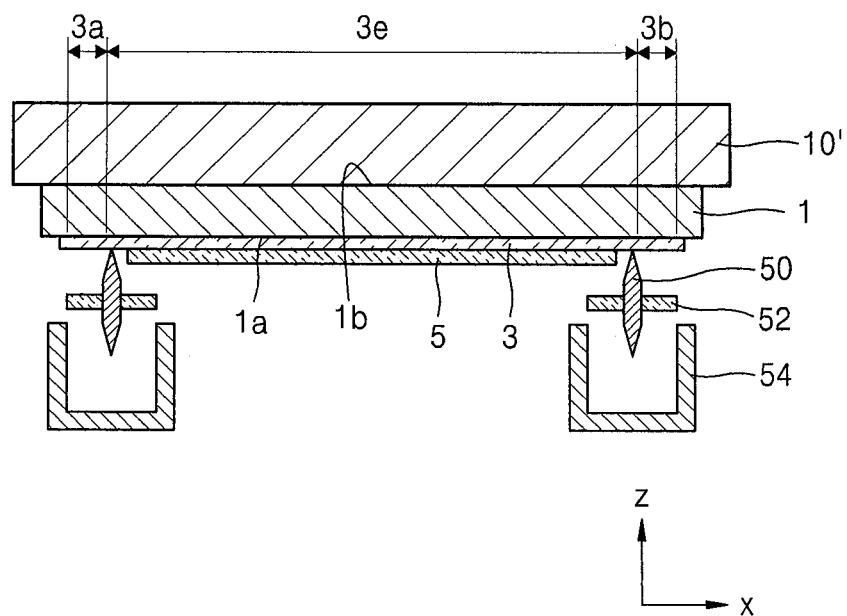
FIG. 3 is a schematic cross-sectional view illustrating a process of a method of manufacturing a display, according to an example embodiment of the present invention.

Alternatively, as illustrated in FIG. 3, at least a portion of a portion 3e of the substrate 3, which is separated from the carrier 1, may be detached from the carrier 1 by cutting the substrate 3. That is, when an adjacent area between the portion 3e of the substrate 3, which is separated from the carrier 1, and portions 3a and 3b of the substrate 3, which are attached to the carrier 1, is cut by using a cutting wheel 50 rotating around an axis 52, the portions 3a and 3b of the substrate 3, which are attached to the carrier 1, remain attached to the carrier 1, but the at least a portion of the portion 3e of the substrate 3, which is separated from the carrier 1, is detached from the carrier 1. According to a cut location, although a part of the substrate 3 may belong to the detached portion 3e of the substrate 3, the part is still directly or indirectly connected to the portions 3a and 3b of the substrate 3, which are attached to the carrier 1, and thus the part may still be directly or indirectly attached to the carrier 1. When the cutting is performed, the carrier 1 may be supported by a carrier chuck 10'.

Although not illustrated in FIG. 3, before the substrate 3 is cut, a supporter supports the substrate 3 and/or the device layer 5, and while the supporter supports the substrate 3 and/or the device layer 5, the substrate 3 may be cut. Because particles may occur during the cutting, as illustrated in FIG. 3, the cutting wheel 50 may cut the substrate 3 arranged or positioned thereabove, while the substrate 3 is arranged or positioned under the carrier 1 (the −z direction). In this case, although particles occur during the cutting, the particles may not be disposed on the device layer 5 or the substrate 3 and fall downward (the −z direction) due to the gravity. The particles may fall into a collector 54 configured to collect the particles and arranged or positioned under the cutting wheel 50.

If the protective film or functional film is attached to the substrate 3 and/or the device layer 5 right after the substrate 3 is detached from the carrier 1, a change of the location of the display may be prevented while the display is being transported, and the substrate 3 may be effectively separated from the carrier 1. Here, the functional film may be a polarization film, a reflection protecting film, a touch film providing the display with a touch function, or the like.

The method of manufacturing the display has been described, but the present invention is not limited thereto.

For example, an apparatus for manufacturing a display which is suitable for the method may also be included in the scope of the present invention.

The apparatus for manufacturing a display according to an example embodiment of the present invention may include the stage 10, the light source 20, and the shield 30.

The carrier 1, to which the substrate 3 is attached to the first surface 1a of the stage 10 in a +z direction, may be disposed on the stage 10. As illustrated in FIG. 1, the device layer 5 including electronic devices such as thin film transistors (TFTs) or display devices may be formed on the substrate 3 attached to the carrier 1 and thus may be disposed on the stage 10.

The light source 20 may emit light onto the second surface 1b of the carrier 1 disposed on the stage 10. The light source 20 may emit, for example, a laser beam.

The shield 30 may be arranged or positioned between the stage 10 and the light source 20 or may be removed from between the stage 10 and the light source 20. For example, the shield 30 may be arranged or positioned between the stage 10 and the light source 20 or may be removed from between the stage 10 and the light source 20 by moving forward or backward, for example, by a sliding method.

The shield 30 may have the first shielding areas 32a and 32b that are not transparent. For example, the shield 30 has the transparent plate 31 and may allow the first shielding areas 32a and 32b to be disposed on the transparent plate 31. For example, the transparent plate 31 may be formed of a glass material, and the first shielding areas 32a and 32b may be formed of various metals such as Cr.

When the shield 30 is arranged or positioned between the stage 10 and the light source 20, the first shielding areas 32a and 32b may correspond to at least portions of the edge areas of the substrate 3 disposed on the carrier 1 on the stage 10.

As illustrated in FIG. 2 which is a plan view schematically illustrating the shield 30, the shield 30 may also include the second shielding areas 32c arranged or positioned on the edge areas of the transparent plate 31 in the +y direction or the −y direction, other than the first shielding areas 32a arranged or positioned on the edge areas of the transparent plate 31 in a −x direction and the first shielding areas 32b arranged or positioned on the edge areas of the transparent plate 31 in a +x direction.

When the shield 30 is arranged or positioned between the stage 10 and the light source 20, the shield 30 allows a portion of light to be shielded by the first and second shielding areas 32a, 32b, and 32c of the shield 30.

When the apparatus for manufacturing the display according to the present example embodiment of the present invention is used, the substrate 3 may not be completely separated from the carrier 1. For example, the light may be irradiated onto the second surface 1b of the carrier 1 by using the light source 20. In this case, as illustrated in FIG. 1, because the shield 30 is arranged or positioned between the second surface 1b of the carrier 1 and the light source 20, the light is not irradiated onto the portions of the second surface 1b of the carrier 1, which correspond to the first and second shielding areas 32a, 32b, and 32c of the shield 30, but mostly irradiated onto the portions of the second surface 1b of the carrier 1, which do not correspond to the first and second shielding areas 32a, 32b, and 32c.

The light irradiated onto the second surface 1b of the carrier 1 passes through the carrier 1 that is transparent and then reaches the substrate 3 attached to the first surface 1a of the carrier 1. Accordingly, the portions of a surface of the substrate 3, which are irradiated with the light and face the first surface 1a of the carrier 1, are mostly separated from the first surface 1a of the carrier 1. For example, when the light reaches the interface between the first surface 1a of the carrier 1 and the substrate 3, the bonding of the substrate 3 to the first surface 1a of the carrier 1 may break due to the light, and thus, the portions of the surface of the substrate 3, which are irradiated with the light and face the first surface 1a of the carrier 1, are mostly separated from the first surface 1a of the carrier 1. As a result, the remaining portions of the substrate 3, other than the at least some portions of the edge areas of the substrate 3, are separated from the first surface 1a of the carrier 1.

When an intensity of the light irradiated onto the second surface 1b of the carrier 1 from the light source 20 is too low, the substrate 3 may not be separated from the carrier 1. Thus, the intensity of the light irradiated onto the second surface 1b of the carrier 1 from the light source 20 needs to be at an intensity in which the substrate 3 is separated from the carrier 1 when the light reaches the substrate 3. The light may be a laser beam.

A thickness of the substrate 3 may be relatively thin in order to manufacture a thin display, and thus, it may be difficult, without damaging the components, to handle the substrate 3 while the substrate 3 is transported in each process or between processes of manufacturing a display. In particular, when the substrate 3 is flexible, it may be relatively difficult to handle the substrate 3. Therefore, the carrier 1 that is solid may be utilized to manufacture a display.

When a display is manufactured by using the carrier 1, the substrate 3 may be separated from the carrier 1. However, even after the substrate 3, on which the device layer 5, etc. is formed, is separated from the carrier 1, the substrate 3 may be handled for further processing or manufacturing. For example, in order to attach a protective film, the substrate 3 may be transported from a separating device, which is configured to separate the substrate 3 from the carrier 1, to the film attaching device, which is configured to attach a protective film to the substrate 3, the device layer 5, or the like. In this case, if the substrate 3 is transported while the substrate 3 is completely separated from the carrier 1, various situations, for example, a situation in which a location of the substrate 3 on the carrier 1, etc. changes, may occur, and accordingly, relative locations of the protective film and the substrate 3 may change. As a result, the protective film may not be properly attached to the substrate 3.

However, when the apparatus for manufacturing the display according to one or more example embodiments of the present invention is used, most areas of the substrate 3 may be separated from the carrier 1, but at least some portions of the edge areas of the substrate 3 may not be separated from the carrier 1. Therefore, as described above, a change of the location of the substrate 3 on the carrier 1, etc., may be effectively prevented, wherein the change may occur while the substrate 3 and/or the carrier 1 are being handled.

According to some embodiments, the substrate 3 may be completely separated from the carrier 1 in order to attach the protective film to the substrate 3, the device layer 5, or the like. In this case, although the substrate 3 is not completely separated from the carrier 1, the substrate 3 may be transported in the vicinity of the film attaching device, and then the substrate 3 may be completely separated from the carrier 1 right before the substrate 3 enters the film attaching device, thereby greatly decreasing a defect occurrence probability during the manufacture of the display.

Methods of completely separating the substrate 3 from the carrier 1 may vary. For example, the substrate 3 may be mechanically detached from the carrier 1. Alternatively, as illustrated in FIG. 3, at least a portion of the portion 3e of the substrate 3, which is separated from the carrier 1, may be detached from the carrier 1 by cutting the substrate 3. In this case, for example, an area around the portion 3e of the substrate 3, which is separated from the carrier 1, and the portions 3a and 3b of the substrate 3, which are attached to the carrier 1, may be cut by using the cutting wheel 50 rotating around the axis 52. As a result, the portions 3a and 3b of the substrate 3, which are attached to the carrier 1, may remain attached to the carrier 1, but the at least a portion of the portion 3e of the substrate 3, which is separated from the carrier 1, may be detached from the carrier 1. When the cutting is performed, the carrier 1 may be supported by the carrier chuck 10'.

Due to particles that may occur during the cutting, as illustrated in FIG. 3, the cutting wheel 50 may cut the substrate 3 arranged or positioned thereabove, while the substrate 3 is arranged or positioned under the carrier 1 (a −z direction). In this case, while particles occur during the cutting, the particles may not be deposited on the device layer 5 or the substrate 3 and may fall downward (the −z direction) due to gravity. The particles may fall into the collector 54 configured to collect the particles and arranged or positioned under the cutting wheel 50.

According to the one or more example embodiments of the present invention, a method of manufacturing a display capable of preventing the occurrence of defects during manufacture and reducing manufacturing costs, and an apparatus for manufacturing the display which may perform the method. However, the scope of the present invention is not limited to the above.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. A method of manufacturing a display, the method comprising:
    forming a display device on a substrate attached to a first surface of a carrier;
    arranging, at a second surface of the carrier, a shield that corresponds to at least a portion of edge areas of the substrate and comprises non-transparent shielding areas overlapping regions of the substrate; and
    irradiating light onto the second surface of the carrier to separate a portion of the substrate from the carrier, at least a part of the overlapping regions of the substrate not being separated from the carrier by the irradiated light.

2. The method of claim 1, wherein, in the irradiating the light onto the second surface of the carrier, a portion of the light is blocked by the shielding areas.

3. The method of claim 1, wherein in the irradiating, the light has an intensity at which a portion of the substrate, onto which the light is irradiated, is separated from the carrier.

4. The method of claim 1, further comprising forming the substrate by coating a material for forming the substrate on the first surface of the carrier.

5. The method of claim 1, further comprising detaching at least a portion of the substrate, which is separated from the carrier, by cutting the substrate.

6. The method of claim 5, further comprising attaching a functional film to a surface of the substrate that has contacted the carrier,
    wherein the attaching is performed right after the detaching is performed.

7. The method of claim 1, further comprising mechanically detaching the substrate from the carrier.

8. The method of claim 7, further comprising attaching a functional film to a surface of the substrate that has contacted the carrier,
    wherein the attaching is performed right after the detaching is performed.

9. The method of claim 1, wherein the arranging comprises arranging the shield having a first shielding area and a second shielding area which are separated from each other.

10. The method of claim 1, wherein the carrier is transparent.

* * * * *